United States Patent
Mebarki et al.

(10) Patent No.: US 9,631,278 B2
(45) Date of Patent: Apr. 25, 2017

(54) METAL SILICIDE FORMATION THROUGH AN INTERMEDIATE METAL HALOGEN COMPOUND

(71) Applicant: Applied Materials, Inc., Santa Clara, CA (US)

(72) Inventors: Bencherki Mebarki, Santa Clara, CA (US); David Thompson, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 14/919,196

(22) Filed: Oct. 21, 2015

(65) Prior Publication Data

US 2016/0222505 A1 Aug. 4, 2016

Related U.S. Application Data

(60) Provisional application No. 62/110,424, filed on Jan. 30, 2015.

(51) Int. Cl.
*C23C 16/00* (2006.01)
*C23C 16/56* (2006.01)
*C23C 16/18* (2006.01)
*C23C 16/42* (2006.01)

(52) U.S. Cl.
CPC .............. *C23C 16/56* (2013.01); *C23C 16/18* (2013.01); *C23C 16/42* (2013.01)

(58) Field of Classification Search
CPC ................................ C23C 16/56; C23C 16/08
See application file for complete search history.

(56) References Cited

U.S. PATENT DOCUMENTS

| | | | |
|---|---|---|---|
| 5,977,581 A | 11/1999 | Thakur et al. | |
| 6,140,230 A * | 10/2000 | Li | H01L 21/28518 257/E21.165 |
| 6,251,777 B1 | 6/2001 | Jeng et al. | |
| 6,326,668 B1 | 12/2001 | Li | |
| 7,208,398 B2 * | 4/2007 | Chen | H01L 21/28518 257/E21.165 |
| 8,358,144 B2 | 1/2013 | Maruyama et al. | |
| 2007/0082468 A1 * | 4/2007 | Blalock | C23C 16/14 438/584 |

* cited by examiner

*Primary Examiner* — Kelly M Gambetta
(74) *Attorney, Agent, or Firm* — Servilla Whitney LLC

(57) ABSTRACT

Methods for depositing or forming a metal silicide layer are disclosed. A metal halide layer is deposited, cleaned by a halogen and subjected to a siliciding agent to form the metal silicide.

14 Claims, 1 Drawing Sheet

METAL SILICIDE FORMATION THROUGH AN INTERMEDIATE METAL HALOGEN COMPOUND

CROSS-REFERENCE TO RELATED APPLICATIONS

This application claims priority to U.S. Provisional Application No. 62/110,424, filed Jan. 30, 2015, the entire disclosure of which is hereby incorporated by reference herein.

FIELD

Embodiments of the disclosure generally relate to methods for forming metal silicides. More particularly, embodiments of the disclosure relate to methods for depositing a nickel silicide interconnect.

BACKGROUND

Integrated circuits have evolved into complex devices that can include millions of components (e.g., transistors, capacitors and resistors) on a single chip. The evolution of chip designs continually requires faster circuitry and greater circuit densities. The demand for greater circuit densities necessitates a reduction in the dimensions of the integrated circuit components.

As the dimensions of the integrated circuit components are reduced (e.g., sub-micron dimensions), the materials used to fabricate such components contribute to the electrical performance of such components. As the feature widths decrease, the device current typically remains constant or increases, which results in an increased current density for such features. Higher device densities, faster operating frequencies, and larger die sizes have created a need for a metal with lower resistivity than traditional aluminum to be used in interconnect structures. Copper materials with lower resistivity have been used for decades for its high conductivity. However, the small size features may result in increased resistivity of copper as line widths shrink below around 50 nm and approach the mean free path of electrons in copper (39 nm). The resistivity increase is caused by electron scattering at the surface of the line and at grain boundaries.

Conventional copper wire may also be damaged by electromigration when current density exceeds certain levels. Electromigration defects threaten the reliability of nanometer-size copper interconnects. Electromigration causes internal and external cavities that lead to wire failure. For example, electromigration may lead to increased electrical resistance or even an open circuit if a sufficiently large void forms within the copper interconnection.

Beyond the 5 nm technology node, new materials and schemes need to be implemented in Back-End-of-Line (BEOL) Interconnect to keep up with Moor's law. Convention metal based interconnects will likely not be effective. New disruptive materials and schemes are required. Silicide based interconnect are one among other potential paths being explored. Other candidates include carbon nano-tubes, graphene, optical and spintronics. It is believed that silicide based interconnects are a probable candidate to extend CMOS schemes beyond the 5 nm node. Carbon nano-tubes and graphene both require atomic switches to be implemented. Spintronics requires electron-spin based switches. Optical interconnect is cumbersome, requiring cooling systems and are larger, going against the scalability trend.

Silicides have been implemented in the semiconductor industry in Front-End-of-Line (FEOL) processes. FEOL processes can tolerate high thermal budgets over 650° C. BEOL processing cannot tolerate high thermal budgets due to low-k damage that occurs for temperatures higher than 400° C. Therefore, there is a need in the art for materials and methods for forming metal interconnections within the low thermal budget requirements of BEOL processes.

SUMMARY

One or more embodiments of the disclosure are directed to deposition methods. A metal halide layer is formed on a substrate surface. The metal halide layer is cleaned by exposure to a halogen gas to form a clean metal halide layer. The clean metal halide layer is exposed to a siliciding agent to form a metal silicide.

Additional embodiments of the disclosure are directed to deposition method comprising forming a nickel halide layer on a substrate surface. The nickel halide layer is cleaned by exposure to a halogen gas to form a clean nickel halide layer. The clean nickel halide layer is exposed to a siliciding agent to form a nickel silicide.

Further embodiments of the disclosure are directed to deposition methods comprising forming a nickel chloride layer on a substrate surface by chemical vapor deposition. The nickel chloride layer is cleaned by exposure to chlorine gas to form a clean nickel chloride layer. The clean nickel chloride layer is exposed to a siliciding agent comprising one or more of $SiH_4$, $Si_2H_6$, $SiF_4$, $SiH_2Cl_2$, $Si_4H_{10}$ or $Si_5H_{12}$ to form a nickel silicide. Each of forming the nickel chloride layer, cleaning the nickel chloride layer and siliciding the nickel chloride layer occurs at a temperature less than or equal to about 400° C.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. However, that the appended drawings illustrate only typical embodiments of this disclosure and are therefore not to be considered limiting of scope, for the disclosure may admit to other equally effective embodiments.

DETAILED DESCRIPTION

Embodiments of the present disclosure describe methods for forming a metal silicide layer that may be utilized as conductive nanowires in back-end interconnect structures for semiconductor device manufacturing. In one example, the metal silicide layer is formed by a deposition process under a temperature of about 400° C.

Embodiments of the disclosure provide methods to generate a silicide based interconnect for back-end-of-line applications at temperatures below 400° C. Chemical Vapor Deposition and Atomic Layer Deposition techniques are known for impurity incorporation. Some embodiments of the disclosure eliminate or reduce the contamination by transiting through a clean metal-chloride compound and annealing in silane to reduce chlorine.

As used in this specification and the appended claims, the term "substrate" and "wafer" are used interchangeably, referring to a surface, or portion of a surface, upon which a process acts. Those skilled in the art will understand that reference to a substrate can also refer to only a portion of the substrate, unless the context clearly indicates otherwise. Additionally, reference to depositing on a substrate can mean a bare substrate and/or a substrate with one or more films or features deposited or formed thereon.

As used in this specification and the appended claims, the terms "reactive gas", "process gas", "precursor", "reactant", and the like, are used interchangeably to mean a gas that includes a reactive species.

Embodiments of the disclosure are directed to methods of generating silicide based interconnects for back-end-of-line applications at temperatures below 400° C. Chemical Vapor Deposition (CVD) and Atomic Layer Deposition (ALD) technologies may result in the incorporation of impurities in deposited films. Embodiments of the disclosure solve the contamination challenge by transiting through a clean metal-halide compound, followed by annealing in a siliciding reagent to reduce the metal halide.

Figure 1:
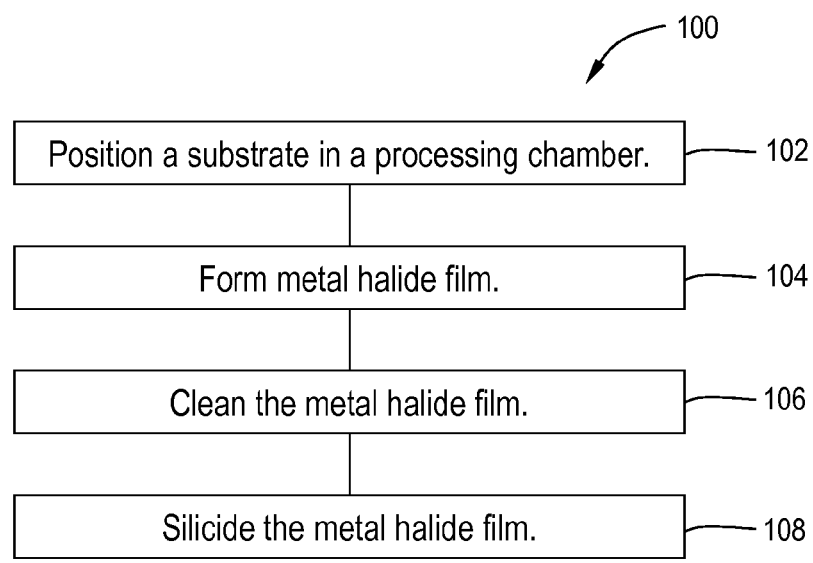
FIG. 1 depicts a manufacturing sequence regarding the formation of a metal silicide layer in accordance with one or more embodiment of the disclosure.
Figures 2A, 2B, 2C:
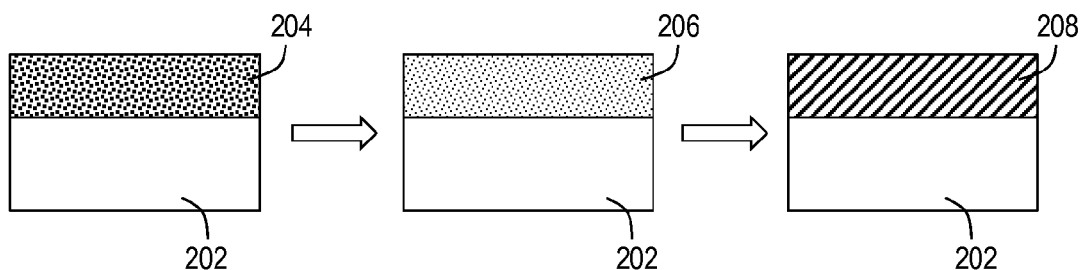
FIGS. 2A through 2C show a schematic representation of the manufacturing sequence of FIG. 1

With reference to FIGS. 1 and 2A through 2C, one or more embodiments of the disclosure are directed to deposition methods 100 for form a metal silicide film. At 102, substrate 202 is positioned in a processing chamber (not shown). The processing chamber can be any suitable processing chamber including, but not limited to, CVD, ALD, PVD or batch processing chambers. In some embodiments, the substrate 202 was positioned in the processing chamber for a process preceding the metal silicide film formation.

Substrates for use with the embodiments of the disclosure can be any suitable substrate. In some embodiments, the substrate is a rigid, discrete, generally planar substrate. As used in this specification and the appended claims, the term "discrete" when referring to a substrate means that the substrate has a fixed dimension. The substrate of one or more embodiments is a semiconductor substrate, such as a 200 mm or 300 mm diameter silicon substrate. In some embodiments, the substrate is one or more of silicon, silicon germanium, gallium arsenide, gallium nitride, germanium, gallium phosphide, indium phosphide, sapphire and silicon carbide.

At 104, a metal halide 204 layer is formed or deposited on the substrate 202. Suitable deposition techniques may be utilized to form the metal halide layer include, but are not limited to, plasma enhanced chemical vapor deposition (PECVD), physical vapor deposition process (PVD), metal organic chemical vapor deposition (MOCVD), thermal chemical vapor deposition (Thermal-CVD) process, low pressure chemical vapor deposition (LPCVD), sub-atmospheric chemical vapor deposition (SACVD) and the like, or any suitable deposition techniques.

In one or more embodiments, the metal halide 204 layer is deposited by chemical vapor deposition comprising exposure of the substrate 202 to a metal precursor and a halide precursor. In the CVD process, both the metal precursor and the halide precursor are flowed into the processing chamber to react in the gas phase and deposit a film on the substrate.

In some embodiments, the metal halide 204 layer is deposited by atomic layer deposition comprising sequential exposure of the substrate 202 to the metal precursor and the halide precursor. In ALD processes, gas phase reactions of the metal precursor and halide precursor are minimized or eliminated. The ALD process can be a time-domain process in which the metal precursor is flowed into the processing chamber; allowed to adsorb onto the substrate surface; and the processing chamber is purged of excess metal precursor. After purging, the halide precursor is flowed into the processing chamber and allowed to react with the adsorbed metal precursor. The substrate generally remains in one position and the processing environment is changed. In some embodiments, the ALD process is a spatial ALD process where the metal precursor and halide precursor are flowed into separate processing regions in a single processing chamber. One or more gas curtains separate the precursor flows to prevent or minimize gas phase reactions. The substrate is then moved between the different processing regions to sequentially expose the substrate to the precursors.

In some embodiments, the metal halide film is formed by a physical vapor deposition (PVD) process. In a sputtering PVD process, the metal halide film is deposited by sputtering material from a target comprising the metal halide. In an evaporative PVD process, a metal halide is vaporized using, for example, an electron beam. The substrate is exposed to the vaporized metal halide to form the film.

The metal precursor can be any suitable metal precursor depending on the metal silicide being formed. Suitable metal precursors comprise one or more of manganese, cobalt, nickel, copper, zinc, zirconium, niobium, molybdenum, ruthenium, rhodium, palladium, silver, hafnium, tantalum, titanium, tungsten, iridium, platinum or gold. In one or more embodiments, the metal precursor comprises nickel. In one or more embodiments, the metal precursor consists essentially of nickel.

In one or more embodiments, the metal comprises nickel, so the metal precursor comprises a nickel-containing compound. In some embodiments, the metal consists essentially of nickel. As used in this regard, "consisting essentially of" means that the metal composition of the film formed has less than or equal to 10 wt % contamination with a different metal. For example, if the metal halide film consists essentially of nickel, then the film has less than or equal to 10 wt % of the metals is not nickel.

Suitable nickel precursors include, but are not limited to, N,N'-di-tert-butylacetamidinato)$_2$Ni, Ni(C$_5$H$_5$)$_2$, Ni[N(t-uut)$_2$], Ni((t-Bu$_2$N)$_2$CCH$_3$)$_2$, bis(cyclopentadieny)nickel, bis(ethylpentadieny)nickel, Ni[(C$_2$H$_5$)(C$_5$H$_4$)$_2$], di(tertiary-butyl)amidonickel or R$_x$O$_v$Ni$_y$(OR')$_z$, where R and R' are independently hydrogen, methyl, ethyl, propyl, isopropyl, butyl, isobutyl, t-butyl, CO, NCO, alkyl or aryl group, x, v and z are integers in the range of 0 and 16 and y is an integer in the range of 0 and 8, and combinations thereof.

The halide precursor can be any suitable precursor that will react with the metal precursor to form the metal halide. In some embodiments, the halide precursor comprises one or more of chlorine, fluorine, bromine, iodine, HCl, HF or HBr.

The metal precursor and/or the halide precursor can be flowed with a carrier gas. The carrier gas is generally an inert gas that serves as a carrier or diluent for the metal precursor. Suitable carrier gases include, but are not limited to, one or more of nitrogen (N$_2$), argon (Ar), hydrogen (H$_2$), alkanes, alkenes, helium (He), oxygen (O$_2$), ozone (O$_3$), water vapor (H$_2$O), or combinations thereof.

After forming the metal halide 204 film, at 106, the metal halide layer is cleaned by exposure to a halogen gas to form a clean metal halide 206 layer. As used in this specification and the appended claims, the term "clean", and the like, used in this respect means that the impurity content of the subject film is decreased. In some embodiments, the cleaned metal halide 206 layer has a decrease in impurity content by at least about 10%, 20%, 30%, 40%, 50%, 60%, 70%, 80% or 90%. In some embodiments, the metal halide layer is a nickel halide layer and cleaning the nickel halide layer comprises exposure to a halogen gas.

The halogen gas can be any suitable halogen gas depending on the halide being formed. For example, if a chloride is being formed, then the halogen gas may comprise chlorine. In some embodiments, the halogen gas consists essentially of chlorine. As used in this regard, "consisting essentially of" means that the halogen composition of the halogen gas is less than or equal to 10 wt % of a different halogen. For example, if the halogen gas consists essentially of chlorine, then the film has less than or equal to 10 wt % of other halogens. Suitable halogens include fluorine, chlorine, bromine, iodine, astatine or combinations thereof. In some embodiments, the halogen gas comprises or consists essentially of molecular chlorine ($Cl_2$), molecular fluorine ($F_2$), molecular bromine ($Br_2$), molecular iodine ($I_2$), molecular asatine ($At_2$) or combinations thereof At 108, the clean metal film 206 is exposed to a siliciding agent to form a metal silicide 208 film. The siliciding agent can be any suitable siliciding agent including, but not limited to, $SiH_4$, $Si_2H_6$, $SiF_4$, $SiH_2Cl_2$, $Si_4H_{10}$, $Si_5H_{12}$, or combinations thereof.

Exposure to the siliciding agent can occur in the same processing chamber or a different processing chamber than any of 104 and 106. For example, the substrate may be moved from a first processing chamber for 104, a second processing chamber for 106 and a third processing chamber for 108 (or back to the first processing chamber). In some embodiments, exposure to the siliciding agent occurs in different processing regions of a single processing chamber so that 104, 106 and 108 occur in spatially separate regions of a chamber with each region separated from adjacent regions by a gas curtain.

In some embodiments, exposure to the siliciding agent at 108 occurs at an elevated or different temperature relative to the 104 and/or 106. For example, the clean metal film 206 (also referred to as a clean metal layer) may be annealed in a siliciding environment to produce the metal silicide film 208. Each of 104, 106 and 108 can occur at different temperatures from any other process. In some embodiments, each of forming the metal halide 104, cleaning the metal halide 106 and forming the metal silicide 108 occur at temperatures below about 400° C., 375° C., 350° C., 325° C. or 300° C.

In one or more embodiments of the disclosure, a nickel silicide film is deposited or formed. A nickel chloride layer is formed on the substrate surface by chemical vapor deposition or atomic layer deposition using a nickel precursor and a chloride precursor. The nickel chloride layer is cleaned by exposure to molecular chlorine gas to form a clean nickel chloride layer. The clean nickel chloride layer is then silicided by exposure to a siliciding agent comprising one or more of $SiH_4$, $Si_2H_6$, $Si_3H_8$, $Si_4H_{10}$ or $Si_5H_{12}$ to form a nickel silicide film.

In some embodiments, one or more layers may be formed during a plasma enhanced atomic layer deposition (PEALD) process. In some processes, the use of plasma provides sufficient energy to promote a species into the excited state where surface reactions become favorable and likely. Introducing the plasma into the process can be continuous or pulsed. In some embodiments, sequential pulses of precursors (or reactive gases) and plasma are used to process a layer. In some embodiments, the reagents may be ionized either locally (i.e., within the processing area) or remotely (i.e., outside the processing area). In some embodiments, remote ionization can occur upstream of the deposition chamber such that ions or other energetic or light emitting species are not in direct contact with the depositing film. In some PEALD processes, the plasma is generated external from the processing chamber, such as by a remote plasma generator system. The plasma may be generated via any suitable plasma generation process or technique known to those skilled in the art. For example, plasma may be generated by one or more of a microwave (MW) frequency generator or a radio frequency (RF) generator. The frequency of the plasma may be tuned depending on the specific reactive species being used. Suitable frequencies include, but are not limited to, 2 MHz, 13.56 MHz, 40 MHz, 60 MHz and 100 MHz. Although plasmas may be used during the deposition processes disclosed herein, plasmas may not be included. Indeed, other embodiments relate to deposition processes under very mild conditions without a plasma.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or the substrate can be moved from the first chamber to one or more transfer chambers, and then moved to the predetermined separate processing chamber. Accordingly, the processing apparatus may comprise multiple chambers in communication with a transfer station. An apparatus of this sort may be referred to as a "cluster tool" or "clustered system", and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants after forming the layer on the surface of the substrate. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

During processing, the substrate can be heated or cooled. Such heating or cooling can be accomplished by any suitable means including, but not limited to, changing the temperature of the substrate support (e.g., susceptor) and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

While the foregoing is directed to embodiments of the present disclosure, other and further embodiments of the disclosure may be devised without departing from the basic scope thereof, and the scope thereof is determined by the claims that follow.

What is claimed is:

1. A deposition method comprising:
   forming a metal halide layer on a substrate surface;
   cleaning the metal halide layer by exposure to a halogen gas to form a clean metal halide layer, the halogen gas consists essentially of chlorine; and
   exposing the clean metal halide layer to a siliciding agent to form a metal silicide.

2. The method of claim 1, wherein the metal comprises nickel.

3. The method of claim 1, wherein the metal consists essentially of nickel.

4. The method of claim 1, wherein the metal halide layer is deposited by chemical vapor deposition comprising exposure to a metal precursor and a halide precursor.

5. The method of claim 4, wherein the metal precursor comprises one or more of N,N'-di-tert-butylacetamidinato)$_2$Ni, Ni(C$_5$H$_5$)$_2$, Ni[N(t-uut)$_2$], Ni(($^t$Bu$_2$N)$_2$CCH$_3$)$_2$, bis(cyclopentadieny)nickel, bis(ethylpentadieny)nickel, Ni[(C$_2$H$_5$)(C$_5$H$_4$)$_2$], di(tertiarybutyl)amidonickel or R$_x$O$_x$Ni$_y$(OR')$_z$, where R and R' are independently hydrogen, methyl, ethyl, propyl, isopropyl, butyl, isobutyl, t-butyl, CO, NCO, alkyl or aryl group, x, v and z are integers in the range of 0 and 16 and y is an integer in the range of 0 and 8.

6. The method of claim 4, wherein the halide precursor comprises one or more of a chlorine, fluorine, bromine, iodine, HCl, HF or HBr.

7. The method of claim 4, wherein one or more of the metal precursor and the halide precursor are flowed with a carrier gas comprising one or more of nitrogen (N$_2$), argon (Ar), hydrogen (H$_2$), alkanes, alkenes, helium (He), oxygen (O$_2$), ozone (O$_3$) or water vapor (H$_2$O).

8. The method of claim 1, wherein the siliciding agent comprises one or more of SiH$_4$, Si$_2$H$_6$, SiF$_4$, SiH$_2$Cl$_2$, Si$_4$H$_{10}$ or Si$_5$H$_{12}$.

9. The method of claim 1, wherein the metal halide layer is deposited by sequential exposure to a metal precursor and a halide precursor.

10. The method of claim 1, wherein forming the metal halide, cleaning the metal halide and forming the metal silicide occur at a temperature below about 400° C.

11. A deposition method comprising:
    forming a nickel halide layer on a substrate surface, the nickel halide layer deposited by chemical vapor deposition comprising exposure to a nickel precursor and a halide precursor, the nickel precursor comprises one or more of N,N'-di-tert-butylacetamidinato)$_2$Ni, Ni(C$_5$H$_5$)$_2$, Ni[N(t-uut)$_2$], Ni(($^t$Bu$_2$N)$_2$CCH$_3$)$_2$, bis(cyclopentadieny)nickel, bis(ethylpentadieny)nickel, Ni[(C$_2$H$_5$)(C$_5$H$_4$)$_2$], di(tertiarybutyl)amidonickel or R$_x$O$_x$Ni$_y$(OR')$_z$, where R and R' are independently hydrogen, methyl, ethyl, propyl, isopropyl, butyl, isobutyl, t-butyl, CO, NCO, alkyl or aryl group, x, v and z are integers in the range of 0 and 16 and y is an integer in the range of 0 and 8;
    cleaning the nickel halide layer by exposure to a halogen gas to form a clean nickel halide layer; and
    exposing the clean nickel halide layer to a siliciding agent to form a nickel silicide.

12. The method of claim 11, wherein the halide precursor comprises one or more of a chlorine, fluorine, bromine, iodine, HCl, HF or HBr.

13. The method of claim 11, wherein the siliciding agent comprises one or more of SiH$_4$, Si$_2$H$_6$, SiF$_4$, SiH$_2$Cl$_2$, Si$_4$H$_{10}$ or Si$_5$H$_{12}$.

14. A deposition method comprising:
    forming a nickel chloride layer on a substrate surface by chemical vapor deposition, the chemical vapor deposition of nickel chloride includes a nickel precursor comprises one or more of N,N'-di-tert-butylacetamidinato)$_2$Ni, Ni(C$_5$H$_5$)$_2$, Ni[N(t-uut)$_2$], Ni(($^t$Bu$_2$N)$_2$CCH$_3$)$_2$, bis(cyclopentadieny)nickel, bis(ethylpentadieny)nickel, Ni[(C$_2$H$_5$)(C$_5$H$_4$)$_2$], di(tertiarybutyl)amidonickel or R$_x$O$_x$Ni$_y$(OR')$_z$, where R and R' are independently hydrogen, methyl, ethyl, propyl, isopropyl, butyl, isobutyl, t-butyl, CO, NCO, alkyl or aryl group, x, v and z are integers in the range of 0 and 16 and y is an integer in the range of 0 and 8;
    cleaning the nickel chloride layer by exposure to chlorine gas to form a clean nickel chloride layer; and
    siliciding the clean nickel chloride layer with a siliciding agent comprising one or more of SiH$_4$, Si$_2$H$_6$, SiF$_4$, SiH$_2$Cl$_2$, Si$_4$H$_{10}$ or Si$_5$H$_{12}$ to form a nickel silicide,
    wherein each of forming the nickel chloride layer, cleaning the nickel chloride layer and siliciding the nickel chloride layer occur at a temperature less than or equal to about 400° C.

* * * * *